United States Patent [19]
Henson

[11] Patent Number: 6,133,054
[45] Date of Patent: Oct. 17, 2000

[54] METHOD AND APPARATUS FOR TESTING AN INTEGRATED CIRCUIT

[75] Inventor: Matthew Brady Henson, Austin, Tex.

[73] Assignee: Motorola, Inc., Schaumburg, Ill.

[21] Appl. No.: 09/366,219

[22] Filed: Aug. 2, 1999

[51] Int. Cl.[7] .................................................. H01L 21/66
[52] U.S. Cl. ................................ 438/17; 438/14; 438/18; 438/462; 257/48
[58] Field of Search ................................ 438/14, 17, 18, 438/462; 257/48, 40, 786, 754, 734, 620, 536, 204; 324/537, 765

[56] References Cited

U.S. PATENT DOCUMENTS

| | | | |
|---|---|---|---|
| 4,288,911 | 9/1981 | Ports ............................................. | 438/17 |
| 4,978,923 | 12/1990 | Maltiel .......................................... | 324/693 |
| 5,399,505 | 3/1995 | Dasse et al. ................................... | 438/17 |
| 5,593,903 | 1/1997 | Beckenbaugh et al. ..................... | 438/18 |
| 5,654,588 | 8/1997 | Dasse et al. ................................... | 257/754 |
| 6,022,750 | 2/2000 | Akram et al. ................................. | 438/18 |

*Primary Examiner*—Donald L. Monin, Jr.
*Assistant Examiner*—Hoai Pham
*Attorney, Agent, or Firm*—Robert A. Rodriguez

[57] ABSTRACT

A method and an associated article of manufacture in which a conductive layer is formed over an uppermost level of interconnect on a semiconductor substrate. The conductive layer is then patterned to form conductive members. At least one of the conductive members includes a first fuse structure in series with a first bond pad portion. The bond pad portion forms an electrical contact with a corresponding integrated circuit device. A voltage is then applied to the device via the conductive member and the bond pad portion. The fuse structure is adapted to form an open between the conductive member and the bond pad portion if the current in the fuse exceeds a predetermined threshold. After the voltage has been applied and the testing completed, the patterned conductive layer is then removed from the semiconductor device prior to final assembly or packaging.

13 Claims, 5 Drawing Sheets

METHOD AND APPARATUS FOR TESTING AN INTEGRATED CIRCUIT

FIELD OF THE INVENTION

The present invention relates to the field of integrated circuit manufacturing and more particularly to the wafer level burn-in of integrated circuited devices.

BACKGROUND OF THE INVENTION

Integrated circuit devices are universally present in essentially every type of electronic system. The various mechanisms by which an integrated circuit device can fail have been the subject of extensive research and literature. One of the primary quality concerns of integrated circuit manufacturers is that devices which are functional when shipped to the customer will fail at some distant time in the future from one or more of a variety of failure mechanisms that are difficult or impossible to detect during the infant stages of the device's lifetime. Integrated circuit manufacturers typically attempt to insure the long term reliability of integrated circuit device by subjecting the device to a set of conditions typically involving elevated temperatures, elevated operating voltages, or both. These conditions are designed to accelerate the onset of any failure mechanisms that the device may exhibit. One well known type of reliability testing is frequently referred to as burn-in. During a typical burn-in sequence, a predetermined set of voltages are applied to specific inputs of the integrated circuit and maintained for an extended period of time. Typical burn-in sequences may be maintained for a duration of anywhere from 24 to 2,000 hours or more. Those familiar with semiconductor fabrication in general and with semiconductor testing in particular will appreciate that the duration required to adequately burn-in a device is extremely long and, thus, it is desirable to be able to burn-in multiple devices simultaneously to minimize the cost of the burn-in test.

Historically, burn-in testing did not occur until after the integrated circuit device had been packaged. After packaging, an integrated circuit device was typically inserted into a socket attached to a relatively large printed circuit board capable of simultaneously burning in a large number of devices. To avoid the cost associated with packaging devices that would ultimately fail at burn-in and to accommodate burn-in of direct chip attach (DCA) applications such as "flip chip" devices in which the device is not packaged in a traditional package at all, integrated circuit manufacturers have devised methods for burning in integrated circuits at the wafer level. In Dasse, et al., U.S. Pat. No. 5,399,505 and Dasse, et al U.S. Pat. No. 5,654,588 (both of which are both incorporated by reference herein), an apparatus and method for performing wafer level burn-in are disclosed. Wafer level burn-in is the process of simultaneously burning in all of the devices on an entire wafer prior to final assembly or packaging of the devices.

In a typical wafer level burn-in application, multiple devices are connected in parallel to a common power supply or signal generator. The multiple devices connected to any single power supply or signal generator define a cluster or group. If one or more of the devices in a cluster is defective such that it draws an excessively large current when the burn-in test conditions are applied, the excessive current draw will prevent the power supply from providing the necessary voltages to the remaining devices in the cluster. When this situation occurs, the remaining devices in the cluster are prevented from being properly burned in. Without receiving proper burn-in, the remaining devices in the cluster typically must be discarded even if they are otherwise functional because the reliability of these devices has not been adequately determined. Thus, in a conventional wafer level burn-in application, fully functional and operational devices often must be discarded because conventional wafer level burn-in testing systems are incapable of isolating defective and high current devices from the remaining devices in the cluster such that the remaining devices receive a proper burn-in signal. While this problem could be addressed by dedicating separate drivers and power supplies to each device on the wafer, the cost of doing so would be astronomical. The fear of discarding large numbers of functional devices because of a single bad device in a cluster motivates manufacturers to burn-in devices using small clusters, but small clusters result in extra testing cost in the form of additional probing hardware required to probe each cluster and additional power supplies and logic signal generators for each cluster. Therefore, it is highly desirable to provide a solution enabling the wafer level burn-in testing of multiple integrated circuits that is capable of isolating non-functional or defective devices from the burn-in signals during the burn-in test such that the remaining devices receive an adequate burn-in test. It is further desirable that the implemented solution does not significantly increase the hardware required to perform the wafer level burn-in and does not otherwise significantly increase the cost or time required to complete the burn-in.

SUMMARY OF THE INVENTION

The goals identified above are in large part achieved by a method and apparatus according to the present invention. Broadly speaking, the present invention contemplates a method for testing a semiconductor device in which a conductive layer is formed over an uppermost level of interconnects on a semiconductor substrate. The conductive layer is then patterned to form conductive members. At least one of the conductive members includes a first fuse structure in series with a first bond pad portion. The bond pad portion forms an electrical contact with a bond pad structure of a corresponding integrated circuit device. A voltage is then applied to the device via the conductive member and the bond pad portion. The fuse structure is adapted to form an open between the conductive member and the bond pad portion if the current in the fuse exceeds a predetermined threshold. After the voltage has been applied and the testing completed, the patterned conductive layer is then removed from the semiconductor device prior to final assembly or packaging. In one embodiment, the fuse structure comprises a serpentine conductive link designed to reduce the current at which the fuse blows. In an alternative embodiment, the fuse may comprise a simple "bow tie" structure that minimizes the area consumed by the conductive link. The invention further contemplates an article of manufacture comprising a semiconductor substrate and a plurality of conductive members. The plurality of conductive members overlie an uppermost level of interconnects of the substrate. At least one of the plurality of conductive members includes a fuse structure in series between the conductive member and a bond pad portion. The bond pad portion forms an electrical contact with one of a plurality of integrated circuit devices that comprise the semiconductor substrate. The semiconductor substrate preferably includes one or more levels of transistors and one or more levels of permanent interconnect layers for selectively coupling the transistors.

The present invention will be understood by one skilled in the art from the detailed description below in conjunction with the accompanying drawings.

BRIEF DESCRIPTION OF THE FIGURES

The present invention is illustrated by way of example and not limitation in the accompanying figures, in which like references indicate similar elements, and in which.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE FIGURES

Figure 1:
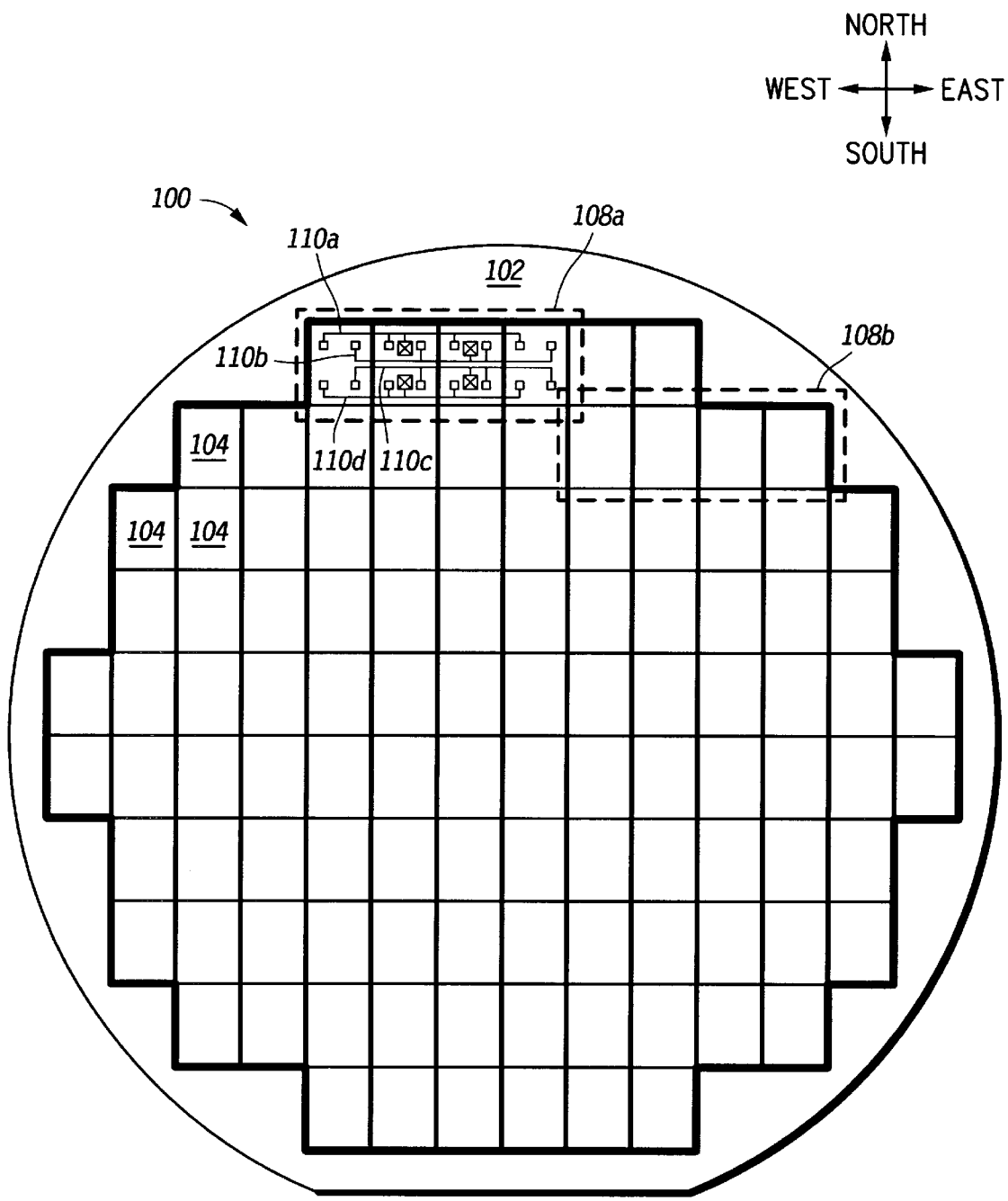
FIG. 1 illustrates a top view of a semiconductor wafer according one embodiment of the present invention.

Turning now to the drawings, FIG. 1 indicates an article of manufacture 100 (alternatively referred to throughout this disclosure as wafer 100) including a plurality of integrated circuit devices or dice 104 arranged in a two dimensional array over the surface of wafer 100. Integrated circuit devices 104 may comprise any of a wide variety of integrated circuit devices including, for example, general purpose microprocessors, embedded controllers, memory devices, digital signal processors, application specific integrated circuits, or any other suitable semiconductor device. Integrated circuit devices 104 are fabricated according to any of a wide variety of well-known semiconductor fabrication processes including CMOS, bipolar, and hybrid fabrication processes.

Figure 7:
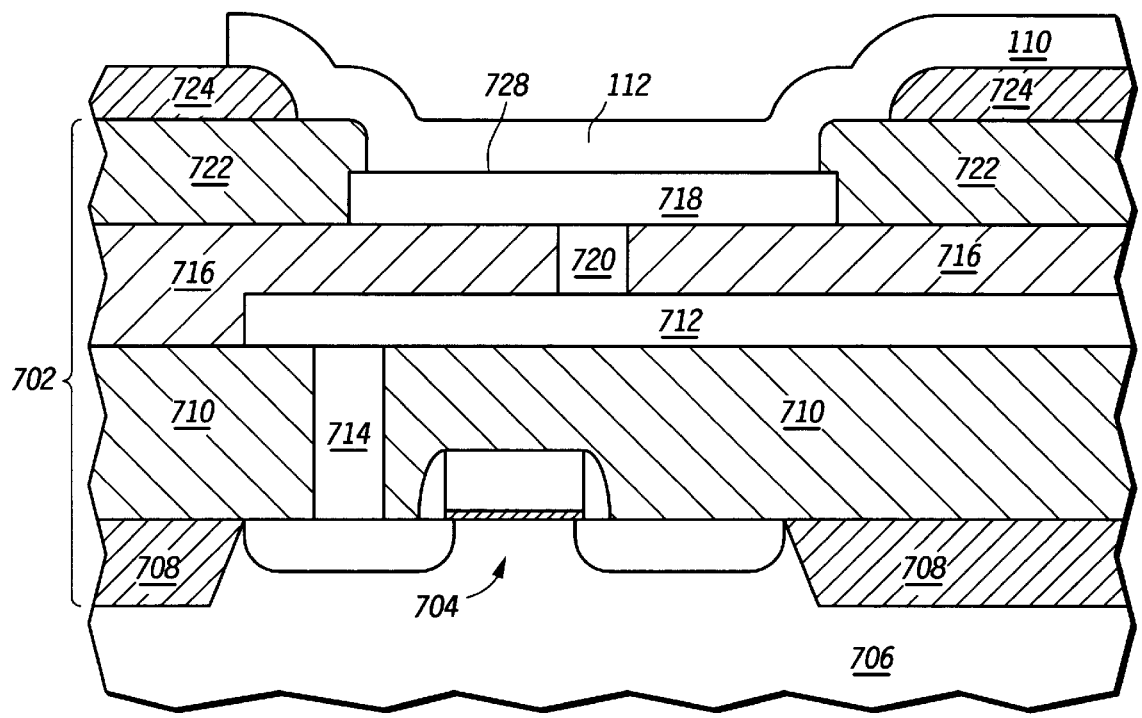
FIG. 7 is a partial cross sectional view of a semiconductor substrate including a conductive layer overlying the uppermost level of interconnects according to the present invention.

Turning momentarily to FIG. 7, a partial, cross-sectional view of wafer 100 is depicted including a semiconductor substrate 702 and a conductive member 110 formed thereon. Semiconductor substrate 702 includes a set of transistors 704 (only one of which is shown in FIG. 7), that are preferably fabricated upon a single crystal semiconductor lattice 706 comprised of a suitable semiconductor material such as silicon. Alternatively, the semiconductor substrate 702 may be a semiconductor-on-insulator substrate, or any other substrate used in forming semiconductor devices. While the depicted embodiment of transistor 704 illustrates the familiar MOS transistor structure, the invention is equally applicable to bipolar and hybrid technologies. Transistors 704 are isolated from one another by shallow trench isolation structures 708. Other embodiments of wafer 100 may utilize other isolation structures including local oxidation (LOCOS) isolation structures, which are well known to those skilled in the field of semiconductor fabrication processing. A first dielectric layer 710 separates transistors 704 from an overlying first conductive layer 712, which is patterned to selectively contact and interconnect underlying transistors 704 through first conductive contact structures 714 (one of which is shown). A dielectric layer 716 separates first interconnect level 712 from an uppermost interconnect level 718, which is selectively interconnected with first interconnect level 712 via one or more second conductive contact structures 720 (one of which is shown). Those familiar with integrated circuit processes will appreciate that, although the depicted embodiment illustrates an uppermost interconnect level 718 formed directly over a first interconnect level 712, (i.e., a two-level metal process) it will be appreciated by those knowledgeable in the field that one or more intermediate interconnect levels may be fabricated between first interconnect level 712 and uppermost interconnect level 718. Regardless of the number of interconnect levels, a passivation layer 722 is preferably formed over the entire wafer 100 and etched to selectively expose the bonding pads 728 of wafer 100. The materials used for the various components of wafer 100 can include, for example, deposited or thermally formed silicon-oxide films for dielectric layers 710 and 716, aluminum, copper, or alloys thereof for interconnect levels 712 and 718, tungsten or polysilicon for conductive contact structures 714 and 720, and silicon oxynitride or plasma-enhanced nitride for passivation layer 722. In addition, those of ordinary skill in the art appreciate that either of the interconnect levels 712 and 718 can alternatively be formed using conventional inlaid metalization processes or, alternatively, the combination of the interconnects 712 and 718 and the conductive contact structures 714 and 720 can be formed using dual-inlaid metalization processes. The depicted embodiment of wafer 100 includes a moisture protection film in the form of a polyimide layer 724 that is formed over passivation layer 722. As contemplated in the present invention, semiconductor substrate 702 contains all the necessary transistors and interconnects to perform the functionality for which integrated circuit device 104 is designed. To achieve a wafer level burn-in test, however, wafer 100 according to one embodiment of the present invention additionally includes a conductive member 110 including a bond pad portion 112 formed over an uppermost interconnect level 718. As described in greater detail below, conductive member 110 is a temporary member that is fabricated above passivation layer 722 of semiconductor substrate 702 specifically to facilitate wafer level burn-in testing of integrated circuit devices 104.

The fabrication of conductive members 110 for wafer level burn-in testing is achieved in accordance with one embodiment by forming a temporarily conductive layer over the uppermost interconnect level 718 and passivation layer 722 of substrate 702. The temporary conductive layer is formed using conventional deposition processes and can be formed using conductive material such as copper, aluminum, tin or an appropriate alloy thereof on the polyimide layer 724. After the deposition or formation process is completed, the conductive layer is patterned using conventional photolithographic and etch techniques to form the conductive members 110 as seen in FIG. 1.

Figure 2:
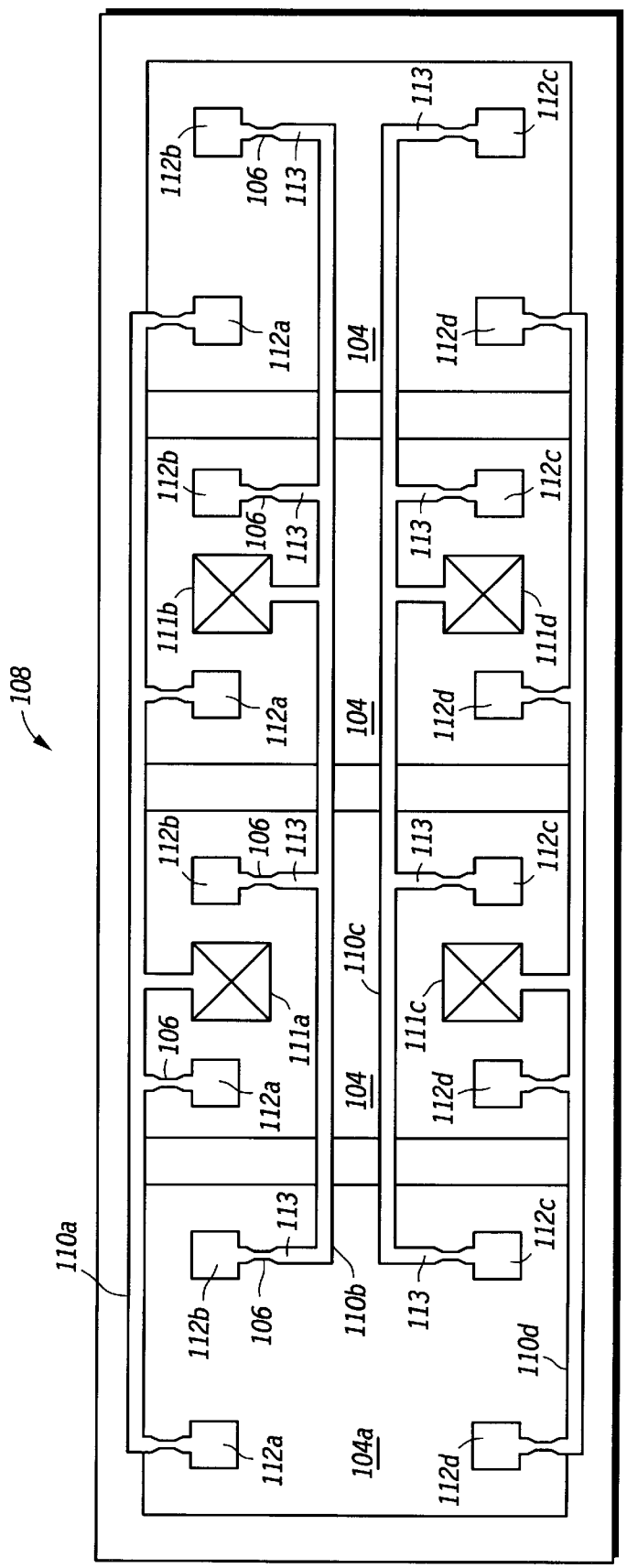
FIG. 2 is a top view of a group of integrated circuit die interconnected with a wafer-level burn-in metalization according to the present invention.

Referring again to FIG. 1 and to FIG. 2, further description of the arrangement of the wafer level burn-in conductive members 110 is described. As indicated previously, integrated circuit devices 104 are arranged in a two dimensional array over the area of wafer 100. For wafer level burn-in purposes, the set of devices 104 are organized into groups 108 (two of which, first group 108a and second group 108b, are indicated in FIG. 2). Each group 108 includes a plurality of devices 104. In the depicted embodiment, each group 108 includes four devices 104. Each group 108 is a mutually exclusive subset of the set of devices 104 in wafer 100. Each group 108 includes a set of conductive members 110. The set of conductive members 110 in group 108 as depicted in FIG. 2 includes first conductive member 110a, second conductive member 110b, third conductive member 110c, and fourth conductive member 110d. Each conductive member 110 is preferably designed to deliver a burn-in signal or power supply voltage to each of the devices 104 in a group 108 via the set of bond pad portions 112 to which each conductive member 110 is connected. Each bond pad portion 112 serves as an electrical contact region to provide an electrical contact to an underlying bond pad structure of the corresponding integrated circuit device 104. Thus, each conductive member 110 of group 108 is electrically coupled to one or more corresponding bond pad portions 112. First conductive member 110a, for example, is connected to each first bond pad portion 112a in group 108. In one embodiment, there is one first bond pad portion 112a for each device 104 in group 108. Similarly, second conductive member 110b is connected to each second bond pad portion 112b where there is one second bond pad portion 112b associated with each device 104 in the group 108 and so forth with respect to third and fourth conductive members 110c and 110d. Preferably, each bond pad portion 112 contacts a functionally similar or equivalent bond pad of each integrated circuit device 104. If, as an example, first bond pad portion 112a of first device 104a contacts the device's VDD bond pad structure, then first bond pad portion 112a of second device 104b also contacts its VDD bond pad structure. Thus, in the depicted embodiment, a unique conductive member 110 is used for each burn-in signal and each conductive member 110 couples to a corresponding bond pad portion 112 on each integrated circuit 104 in group 108. The depicted embodiment is suitable for an application in which it is desired to drive four burn-in signals since there are four conductive members 110a, 110b, 110c, and 110d. In this embodiment, as an example, first conductive member 110a may be used to carry a VDD signal, second conductive member 110b may carry a clock signal, third conductive member 110c for a data or address input signal or a reset signal, and fourth conductive member 110d for VSS or ground. In addition, each conductive member 110 includes a connection to four bond pad portions 112, corresponding to one bond pad portion 112 of each device 104 in group 108.

Each conductive member 110 includes a fuse structure 106 in series between a corresponding bond pad portion 112 and a conductive lead portion 113. First conductive member 110a is shown as connected to a set of four fuses 106 via corresponding conductive lead portions 113. Each fuse 106 is connected in series between its corresponding conductive lead 113 and a first bond pad portion 112a where there is a first bond pad portion corresponding to each device 104 of group 108. Similar connections are indicated with respect to second conductive member 110b, third conductive member 110c and fourth conductive member 110d. Each conductive member 110 is also connected to a corresponding probe pad 111. The probe pads 111 are preferably of a dimension suitable for being contacted by a mechanical probing device. Although the depicted embodiment shows a group 108 consisting of four integrated circuit devices 104, the invention contemplates that each group 108 may include any number of integrated circuit devices 104. In the preferred embodiment the signals are applied to the appropriate conductive members 110 by contacting the corresponding probing pads 111 with a mechanical probing device that is attached to a suitable test generation and control system.

The inclusion of fuse structures 106 in series between conductive members 110 and the corresponding grounding pad portions 112 beneficially provides a mechanism for isolating a faulty integrated circuit device 104 from the remaining integrated circuits such that the remaining integrated circuits may continue to be burned in even after a non-functional integrated circuit has failed. In the absence of fuse structures 106, none of the integrated circuits 104 within a group 108 would receive adequate burn-in testing if any of the devices 104 was defective. If, for example, first integrated circuit 104a drew an excessively high operating current, the power supply driving the appropriate conductive member 110 would be unable to maintain the required voltage on any of the bonding pad portions 112 connected to conductive member 110. With the fuse structures 106, the present invention contemplates a method of testing integrated circuit devices 104 in parallel wherein, after the formation and patterning of the conductive layer to form conductive members 110 including the fuse structures 106, a voltage is applied to the bonding pads 112a of a group 108 of integrated circuit devices 104 via their conductive members 110. If any integrated circuit device 104 in group 108 draws an excessive current, the fuse structure 106 corresponding to the defective device will become open or blown thereby disconnecting the corresponding bond pad portion 112 from the conductive member 110. In this manner, the conductive member 110 is able to drive the appropriate signal level to the remaining bonding pads 112 of the remaining integrated circuits 104 within group 108.

By providing the ability to isolate faulty devices from the remaining devices within a group of integrated circuits, the fuse structures 106 of the present invention enable the burn-in testing of larger groups 108 (i.e. groups that include a larger number of integrated circuit devices 104). Larger groups 108 of integrated circuit devices 104 are desirable to reduce the number of power supplies, signal generators, and probing hardware necessary to fully test wafer 100. Each group 108 of integrated circuits 104 is typically connected to its own power supply and signal generators. In addition, the probing pads 111 of each group 108 must be contacted by probing hardware that is electrically coupled to a power supply and signal generator test system to drive the necessary signals on conductive members 110. The ability to use larger groups 108 of integrated circuits 104 reduces the number of probing structures, drivers, and power supplies needed thereby reducing the cost and complexity of the wafer level burn-in test system. In conventional wafer level burn-in test systems, the lack of fuses such as fuse structures 106, made it necessary to utilize small groups of integrated circuits because a single faulty device forced the integrated circuit manufacturer to reject all devices within the faulty device's group since none of the devices in the group was adequately burned in. Therefore, the fuse structures 106 enable larger groups 108 of integrated circuit devices 104 to be tested with reduced risk of unnecessarily rejecting reliable integrated circuit devices 104.

The burn in sequence itself may vary from a simple burn in sequence in which just VDD and ground signals are applied to devices 104 to more complex sequences in which one or more logic signals are also applied. In one embodiment, the burn in sequence that is applied to devices 104 is sufficient to initiate a built in self test that is embedded in a nonvolatile memory portion of each device 104. The built in self test is preferably designed to exercise the major functional components and sections of device 104 and may be optimized for burn in testing such as by, for example, including a sequence that maximizes the operating current drawn by device 104. After completing the burn-in sequence, the conductive layer comprised of conductive members 110a is partially or totally removed from wafer 100 prior to final assembly. The removal of conductive members 110a from wafer 100 can be accomplished using conventional etch techniques designed to provide suitable etch selectivity with respect to the underlying structures of semiconductor substrate 702. Because the conductive layer comprised of conductive members 110a is removed from the wafer 100, it is referred to herein as a temporary layer in contrast to the permanent interconnect layers 712 and 718 as depicted in FIG. 7, without which device 104 would be non-functional.

Figure 3:
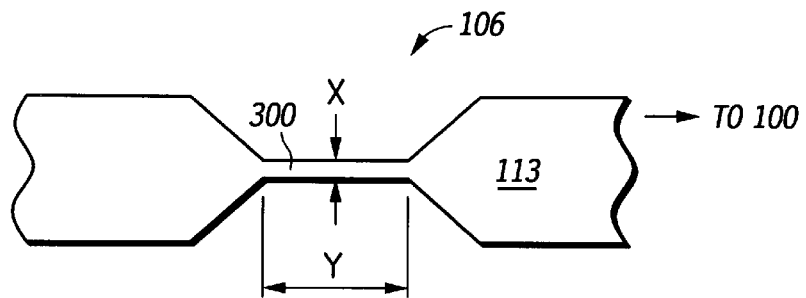
FIG. 3 illustrates a "bow tie" fuse structure in accordance with one embodiment of the present invention.
Figure 4:
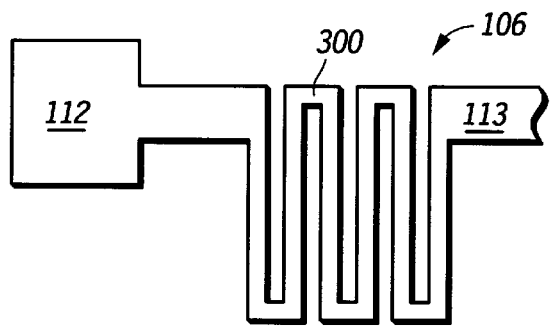
FIG. 4 illustrates a serpentine fuse structure in accordance with one embodiment of the present invention.
Figure 5:
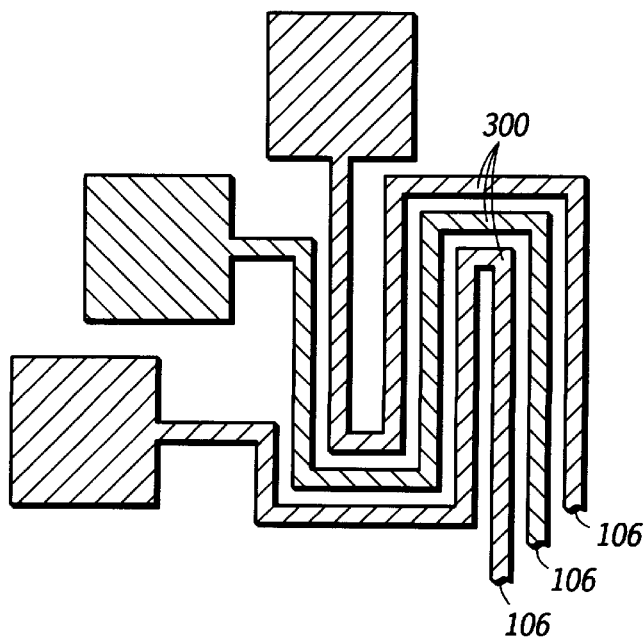
FIG. 5 illustrates a set of serpentine fuse structures in accordance with one embodiment of the present invention.

Turning now to FIGS. 3–5, various embodiments of fuse structures 106 are depicted. In FIG. 3, a "bow tie" fuse structure 106 is shown. In this embodiment, conductive lead portion 113 of fuse structure 106 has a substantially constant width while fusible link 300 has a width X that is substantially narrower. In accordance with one version of this embodiment, the width of conductive lead 113 is at least four times as wide as the width of fusible link 300. It will be appreciated that, for a given current through conductive member 110, the current density within fusible link 300 of fuse structure 106 is significantly higher than the current density in the remaining portions of conductive member 110. If the current through conductive member 110 increases due to a faulty integrated circuit 104, the current density within fusible link 300 of the fuse structure 106 corresponding to integrated circuit device 104 will increase to a point that thermally destroys fusible link 300 creating a blown or open circuit incapable of conducting further current. The dimensions of the fuse may be optimized according to Onderdonk's equation in which $I=A(\log((T_m-T_a)/(234+T_a)+1)/33S)^{1/2}$ where I is the current passing through the fuse, A is the cross sectional area of the metal, $T_m$ is the melting point of the metal (in °C.), $T_a$ is the ambient temperature, and S is the time in seconds. To achieve greater manufacturing efficiencies, it can be advantageous to fabricate the plurality of conductive members 110 using a conventional projection aligner with which the entire wafer may be exposed in a single exposure step thereby increasing throughput. In such an embodiment, a minimum dimension X for fusible link 300 is typically in the range of one micron or greater. In addition, it is desirable if the aspect ratio of fuse link 300 (defined herein as the ratio between the length Y and the width X of fuse length 300) is greater than or equal to 5 and still more desirable if the aspect ration is greater than approximately 10.

While fusible link 300 as depicted in FIG. 3 is desirable for its efficient use of space and its simplicity, the serpentine fuse structure 106 of FIG. 4 is desirable for its ability to blow at lower currents than fuse structure of 106 of FIG. 3. It is theorized that fuse structure 106 of FIG. 3 requires a higher current to create an open circuit because the fusible link 300 is surrounded by a field of passivation or other dielectric material that can effectively act as a heat sink to reduce the temperature of fusible link 300 and thereby resulting in a greater fuse current required to achieve the fuse temperature needed to melt or otherwise blow the fuse. In contrast, the serpentine circuit 106 of FIG. 4 radiates its thermal energy to remaining portions of fusible link 300. In this manner, the serpentine structure of FIG. 4 provides a positive feedback mechanism in which a high current density increases the temperature within fusible link 300 and the higher temperature is radiated to other portions of the fusible link thereby further raising the temperature of fusible link 300 thereby resulting in the generation of a sufficient melting temperature at a significantly lower current value. FIG. 5 presents an extension of the serpentine structure of FIG. 4 in which two or more fuses 106 and fusible links 300 from corresponding conductive members 110 are intertwined such that the thermal energy radiated by one of the links 300 results in the destruction of neighboring fusible links 300. This embodiment is advantageous in an application, for example, where it is desirable to ensure that all signals are disconnected from a circuit whenever any of the remaining signals is disconnected. If, for example, the VDD power supply signal in an integrated circuit device 104 draws a significant current that results in the destruction of its associated fuse structure 106, the remaining clock signals and data signals for that device will continue to be exercised. This may result in a condition in which the ESD circuitry connected to each of these input pads becomes forward biased. When this situation occurs, the clock or data signal associated with the forward biased ESD diode will be unable to drive the appropriate voltage on the corresponding conductive member 110 thereby affecting the burn-in of the remaining good devices. To prevent such an occurrence, it is desirable in one embodiment to blow all fuses 106 associated with a particular integrated circuit device 104 if any of the fuses associated with that device are blown. To accomplish this goal, the intertwined serpentine structure of FIG. 5 contemplates a layout designed to insure that the physical destruction of one fuse structures 300 will cause the physical destruction of neighboring fusible links 300.

Figure 6:
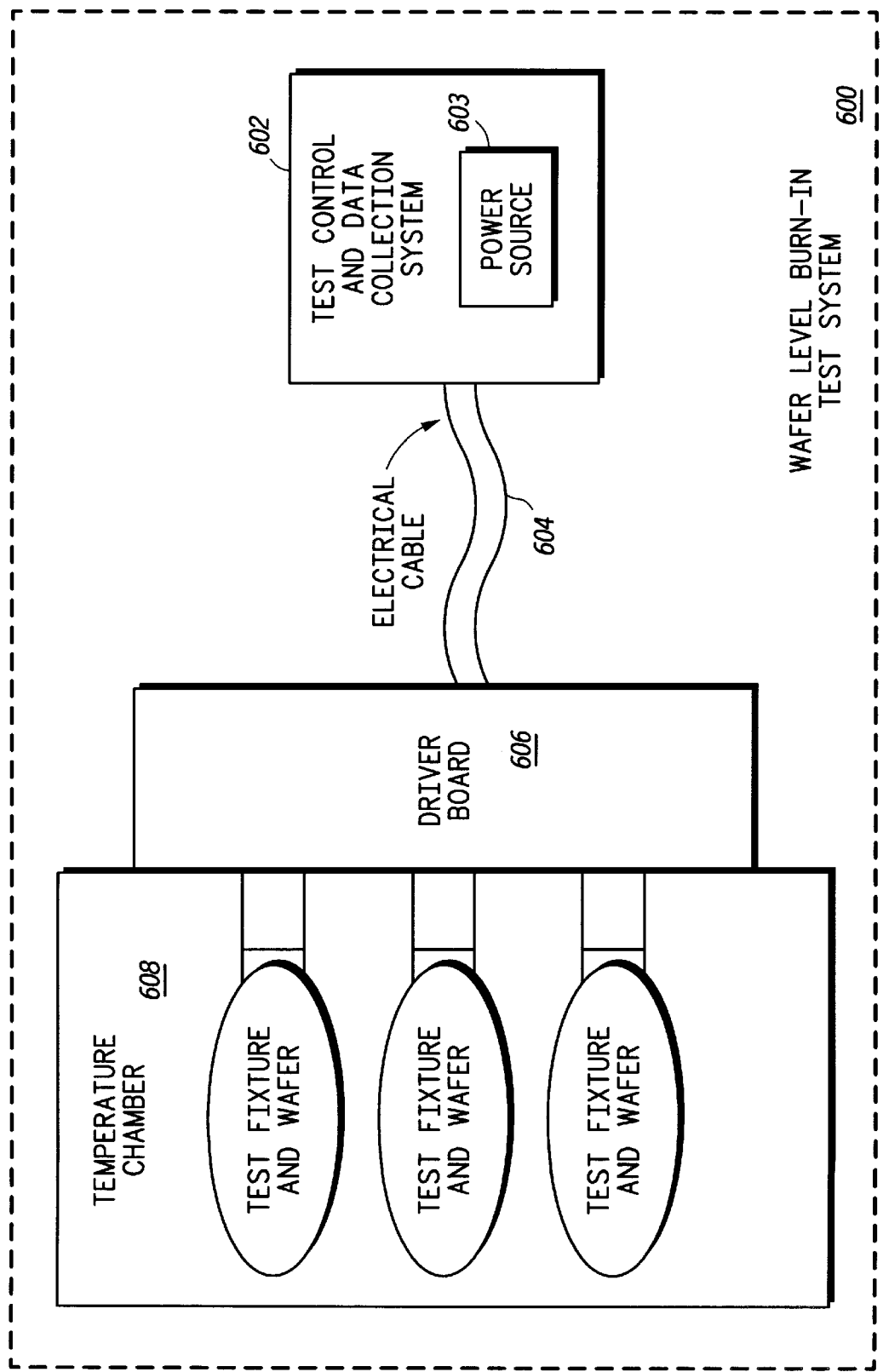
FIG. 6 is a simplified representation of a wafer level burn-in test system according to the present invention.

Turning now to FIG. 6, a wafer level burn-in test system 600 is depicted. Test system 600 includes a control and data collection system 602 including a power source 603. Control system 602 preferably includes sufficient drivers and power supplies necessary to produce the desired burn-in test signals to each group 108 of devices 104. The burn-in test signals that may be applied to an integrated circuit 104 vary widely from device to device and from manufacturer to manufacturer. In any event, the logic and power supply signals supplied by control system 602 are supplied to a driver board 606 via an electrical cable 604. The driver board 606 is suitably connected to a set of test fixtures within a temperature chamber where each test fixture is connected to a wafer 100 according to the present invention. The temperature chamber 608 is suitable for maintaining the wafers at a desired burn-in test temperature. Burn-in testing at elevated temperatures accelerates failure rates by increasing thermal migration activity of impurities that may cause a change in threshold voltages or other operational parameters of the integrated circuit device.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for testing integrated circuits comprising:
   forming integrated circuits on a semiconductor device substrate, wherein the integrated circuits include an uppermost level of interconnects;

forming a polyimide layer over the uppermost level of interconnects;

forming a conductive layer over the polyimide layer, patterning the conductive layer to form conductive members, wherein a first conductive member electrically couples to a first electrical contact portion on a first integrated circuit, and wherein the first conductive member includes a first conductive lead portion and a first fuse portion, wherein the first fuse portion is positioned between the first conductive lead portion and the first electrical contact portion;

applying a voltage to the first electrical contact portion via the first conductive member, wherein the first fuse portion is adapted to forming an electrical open between the first conductive lead portion and the first electrical contact portion if an amount of current flowing through the first fuse portion exceeds a predetermined threshold; and removing at least a portion of the first conductive member.

2. The method of claim 1, wherein the conductive layer includes a material selected from a group consisting of copper, aluminum, and tin.

3. The method of claim 1, wherein a width of the first fuse portion is less than a width of the first conductive lead portion.

4. The method of claim 1, wherein a region of the first conductive lead portion adjacent the first fuse portion has a first width that is substantially constant, and wherein the first fuse portion has a second width, wherein the first width is at least approximately four times greater than the second width.

5. The method of claim 1, wherein the first fuse portion is further characterized as a first serpentine shaped fuse portion.

6. The method of claim 5, wherein a width of the first serpentine shaped fuse portion is less than a width of the first conductive lead portion.

7. The method of claim 6, further comprising at least a second conductive member, wherein the at least a second conductive member includes a second serpentine shaped fuse portion, and wherein the first serpentine shaped fuse portion and the second serpentine shaped fuse portion are formed adjacent each other.

8. The method of claim 7, wherein forming an electrical open between the first conductive lead portion and the first electrical contact portion correspondingly produces an electrical open in the second serpentine shaped fuse portion.

9. The method of claim 1, wherein the first conductive member further comprises a second conductive lead portion and a second fuse portion, and wherein the first conductive member electrically contacts a second electrical contact portion on a second integrated circuit via a the second conductive lead portion and a second fuse portion.

10. The method of claim 9, wherein the first electrical contact portion and the second electrical contact portion are functionally similar contact portions on separate integrated circuits.

11. The method of claim 9, wherein the voltage applied to the first conductive member includes a voltage signal selected from a group consisting of a reset signal, a clock signal, a data input signal, and a voltage supply.

12. The method of claim 1, wherein forming an electrical open between the first conductive lead portion and the first electrical contact portion allows the voltage applied to the first conductive member to provide an appropriate voltage signal to a second electrical contact portion on second integrated circuit.

13. The method of claim 1, wherein applying a voltage is performed during a wafer level burn-in of the integrated circuits on the semiconductor device substrate.

* * * * *